United States Patent
Kinbara et al.

(10) Patent No.: US 6,566,823 B2
(45) Date of Patent: May 20, 2003

(54) DISCHARGE PULSE GENERATOR

(75) Inventors: Yoshihide Kinbara, Tokyo (JP); Takashi Yuzawa, Tokyo (JP); Hajime Ogawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/019,128

(22) PCT Filed: Feb. 22, 2001

(86) PCT No.: PCT/JP01/01300
§ 371 (c)(1), (2), (4) Date: Dec. 27, 2001

(87) PCT Pub. No.: WO02/067410
PCT Pub. Date: Aug. 29, 2002

(65) Prior Publication Data
US 2003/0006721 A1 Jan. 9, 2003

(51) Int. Cl.[7] ............................................. H05B 41/24
(52) U.S. Cl. .................... 315/246; 315/248; 219/69.13
(58) Field of Search .......................... 315/241 R, 246, 315/248, 291, 307, 244, 219; 219/69.13, 69.18; 313/184, 198, 224

(56) References Cited

U.S. PATENT DOCUMENTS 4,112,335 A * 9/1978 Gonser .................. 315/241 R
5,572,003 A * 11/1996 Kaneko .................. 219/69.13
6,456,015 B1 * 9/2002 Lovell et al. ............... 315/246

FOREIGN PATENT DOCUMENTS

| JP | 56-136189 | 10/1981 |
| JP | 7-266133 | 10/1995 |
| JP | 11-8986 | 1/1999 |

* cited by examiner

Primary Examiner—Don Wong
Assistant Examiner—Jimmy T. Vu
(74) Attorney, Agent, or Firm—Sughrue Mion, PLLC

(57) ABSTRACT

A discharge pulse generator for supplying power between a pair of electrodes (1 and 2), comprises a distribution constant line (8) of a predetermined length being connected at one termination to the electrodes (1 and 2), charging means (16) being connected to the distribution constant line (8) for charging the capacitance of the distribution constant line (8), rectification means (13) being connected to an opposite termination of the above-mentioned distribution constant line (8) in a direction in which no current flows relative to voltage of the above-mentioned charging means (16), and a resistor (10) being connected in series to the above-mentioned rectification means (13) and having a resistance value equal to the characteristic impedance of the above-mentioned distribution constant line (8). For example, to use the discharge pulse generator for electric discharge machining, a workpiece can be worked on with higher accuracy and higher quality at higher speed.

20 Claims, 14 Drawing Sheets

DISCHARGE PULSE GENERATOR

TECHNICAL FIELD

This invention relates to improvement in a discharge pulse generator used with an electric discharge machine, a laser oscillator, a particle accelerator, etc., for example, for supplying power between a pair of electrodes.

BACKGROUND OF THE INVENTION

FIG. 17 is a circuit diagram to show the configuration of a discharge pulse generator in a related art and shows an example of a discharge pulse generator of an electric discharge machine. In FIG. 17, numeral 1 denotes an electrode, numeral 2 denotes a workpiece, numeral 3 denotes a DC power supply, numeral 4 denotes a resistor, numeral 5 denotes a capacitor (capacitance C), and L denotes an inductance existing in wiring. A charging circuit made up of the DC power supply 3 and the resistor 4 is connected to the capacitor 5. The electrode 1 and the workpiece 2 are immersed in a work liquid such as water or oil (not shown).

When the voltage of the capacitor 5 is raised by the above-mentioned charging circuit and the work liquid in the gap between poles of the electrode 1 and the workpiece 2 electrically break down, energy stored in the capacitor 5 flows into between the poles of the electrode 1 and the workpiece 2. Discharge current Ig at this time becomes a damped vibration waveform caused by LC oscillation, as shown in FIG. 18.

In FIG. 18, t denotes a time, first current i1 is a current of a half cycle of the resonance frequency of LC oscillation, next current i2 is a current of the opposite polarity to that of the current i1, and current i3 is a current of the opposite polarity to that of the current i2; such several vibration currents flow into between the above-mentioned poles. The pulse width of the first current i1 is a short pulse (T1), but the pulse width where the several vibration currents stop becomes considerably long (T) and discharge continues to occur meanwhile, forming one discharge pulse as a whole. If electric discharge machining is executed using such a discharge pulse generator in the related art, machining based on the pulse T having the comparatively long pulse width rather than machining based on the short pulse T1 is executed and thus it is difficult to finely work on the workpiece 2; this is a problem.

In the discharge pulse generator in the related art as in FIG. 17, bipolar discharge current flows as in FIG. 18. Thus, if setting is made so that electrode consumption lessens in one of the polarities, current always flows also into the direction in which electrode consumption is much, and the electrode consumption grows and thus it becomes difficult to work with high accuracy; this is a problem.

FIG. 19 is a circuit diagram to show the configuration of another discharge pulse generator in a related art disclosed in Japanese Patent Laid-Open No.266133/1995. In the figure, numeral 1 denotes an electrode, numeral 2 denotes a workpiece, numeral 3 denotes a DC power supply, numeral 4 denotes a resistor, numeral 6 denotes a transistor, numeral 7 denotes control means, numerals 8a and 8b denote coaxial cables each with one end side open (characteristic impedances are Z0a and Z0b respectively), and numerals 9a and 9b denote matching impedances connected to the coaxial cables 8a and 8b (impedances are Za and Zb respectively).

FIG. 20 shows an example of discharge current Ig between poles of the electrode 1 and the workpiece 2 in the discharge pulse generator in the related art in FIG. 19. FIG. 20(a) shows the discharge current Ig when the impedances Za and Zb are equal to the characteristic impedances Z0a and Z0b, and FIG. 20(b) shows the discharge current Ig when the impedances Za and Zb are halves the characteristic impedances Z0a and Z0b respectively. In the figure, t denotes a time. If the matching impedances are equal to the characteristic impedances as in FIG. 20(a), the discharge current Ig becomes a pulse-like current waveform with no vibration, but if the matching impedances differ from the characteristic impedances as in FIG. 20(b), the discharge current becomes a vibration-like current waveform as the discharge current in the discharge pulse generator in FIG. 18.

That is, the discharge pulse generator in the related art in FIG. 19 can provide a pulse-like discharge current waveform with no vibration only if the matching impedances are equal to the characteristic impedances of the coaxial cables, and therefore the peak value of the discharge current lowers to a half as the matching impedances are connected; this is a problem.

Since the matching impedances are fixed, if the voltage of the DC power supply 3 is constant, the peak value of the discharge current pulse cannot be changed; this is a problem.

DISCLOSURE OF THE INVENTION

The invention is intended for solving the problems as described above and it is an object of the invention to provide a discharge pulse generator that can raise the peak value of a discharge current pulse.

It is an object of the invention to provide a discharge pulse generator for making it possible to set the peak value of a discharge current pulse to any desired value.

It is an object of the invention to provide a discharge pulse generator fitted for micromachining and capable of decreasing electrode consumption if the discharge pulse generator is used for electric discharge machining.

According to the invention, there is provided a discharge pulse generator for supplying power between a pair of electrodes, comprising at least one distribution constant line of a predetermined length being connected at one termination to the electrodes, charging means being connected to the above-mentioned distribution constant line for charging the capacitance of the above-mentioned distribution constant line, rectification means being connected to an opposite termination of the above-mentioned distribution constant line in a direction in which no current flows relative to voltage of the above-mentioned charging means, and a resistor being connected in series to the above-mentioned rectification means and having a resistance value equal to the characteristic impedance of the above-mentioned distribution constant line.

According to the invention, there is provided a discharge pulse generator for supplying power between a pair of electrodes, comprising at least one distribution constant line of a predetermined length being connected at one termination to the electrode, charging means being connected to the above-mentioned distribution constant line for charging the capacitance of the above-mentioned distribution constant line, rectification means being connected to an opposite termination of the above-mentioned distribution constant line in a direction in which no current flows relative to voltage of the above-mentioned charging means, a resistor being connected in series to the above-mentioned rectification means and having a resistance value equal to the characteristic impedance of the above-mentioned distribution constant line, and a constant voltage source being connected in series to the above-mentioned rectification means.

According to the invention, there is provided a discharge pulse generator for supplying power between a pair of electrodes, comprising at least one distribution constant line of a predetermined length being connected at one termination to the electrode, charging means being connected to the above-mentioned distribution constant line for charging the capacitance of the above-mentioned distribution constant line, rectification means being connected to an opposite termination of the above-mentioned distribution constant line in a direction in which no current flows relative to voltage of the above-mentioned charging means, a resistor being connected in series to the above-mentioned rectification means and having a resistance value equal to the characteristic impedance of the above-mentioned distribution constant line, voltage detection means for detecting voltage of the above-mentioned resistor, voltage polarity determination means for determining the polarity of the voltage of the above-mentioned resistor detected by the above-mentioned voltage detection means, and charging stop means for stopping charging of the above-mentioned charging means if the above-mentioned voltage polarity determination means determines that the polarity of the voltage is opposite to polarity just before discharge.

In the discharge pulse generator, at least one of the above-mentioned distribution constant lines is a repetition circuit of discrete capacitors and inductors forming characteristic impedance equal to the characteristic impedance of the above-mentioned distribution constant line.

In the discharge pulse generator, at least one of the above-mentioned distribution constant lines is implemented as a parallel body of a capacitor being connected in parallel to the above-mentioned rectification means and the above-mentioned resistor and an inductor and a resistor being connected in series to the capacitor and characteristic impedance based on the capacitor and the inductor and a resistance value of the resistor of the parallel body are equal to the characteristic impedance of the above-mentioned distribution constant line.

In the discharge pulse generator, the above-mentioned charging means is implemented as a series body of a DC power supply, a resistor, and switching means and control means for turning on/off the switching means is provided.

In the discharge pulse generator, the above-mentioned charging means is made up of a series body of a DC power supply, a resistor, and a diode connected in a charging direction and switching means connected in parallel between the resistor and the DC power supply of the series body and control means for turning on/off the switching means is provided.

In the discharge pulse generator, a current adjusting resistor is connected in series to the termination of the above-mentioned distribution constant line to which the electrode is connected.

In the discharge pulse generator, the predetermined length of the above-mentioned distribution constant line is set so that the propagation time of the above-mentioned distribution constant line becomes a half any desired discharge current pulse width generated between the poles.

According to the invention, there is provided a discharge pulse generator, for use with a wire electric discharge machine for supplying discharge energy between poles of a wire electrode and a workpiece, relatively moving the wire electrode and the workpiece by positioning means, and working on the workpiece, for generating the discharge energy, the above-mentioned discharge pulse generator comprising a first distribution constant line and a second distribution constant line being connected at one terminations in parallel, an upper feeding part connecting an opposite termination of the above-mentioned first distribution constant line for supplying power to the wire electrode, a lower feeding part connecting an opposite termination of the above-mentioned second distribution constant line for supplying power to the wire electrode, charging means being connected to the above-mentioned first distribution constant line and the above-mentioned second distribution constant line for charging capacitances of the above-mentioned first distribution constant line and the above-mentioned second distribution constant line, rectification means being connected to the one terminations of the above-mentioned distribution constant lines in a direction in which no current flows relative to voltage of the above-mentioned charging means, and a resistor being connected in series to the above-mentioned rectification means and having a resistance value equal to the characteristic impedance of the above-mentioned distribution constant line.

The discharge pulse generator according to the invention is configured as described above and the discharge current rises rapidly and a discharge current pulse of a single pulse of the same polarity is generated. Thus, for example, to use the discharge pulse generator for electric discharge machining, the discharge pulse generator is fitted for micro-machining and can decrease electrode consumption.

The peak value of the discharge current can be set to any desired value.

Further, the discharge pulse generator can produce group discharge at a predetermined repetitive frequency according to the very simple configuration and thus, for example, to use the discharge pulse generator for electric discharge machining, the workpiece can be worked on with higher accuracy and higher quality at higher speed.

BEST MODE FOR CARRYING OUT THE INVENTION

Embodiment 1

Figure 1:
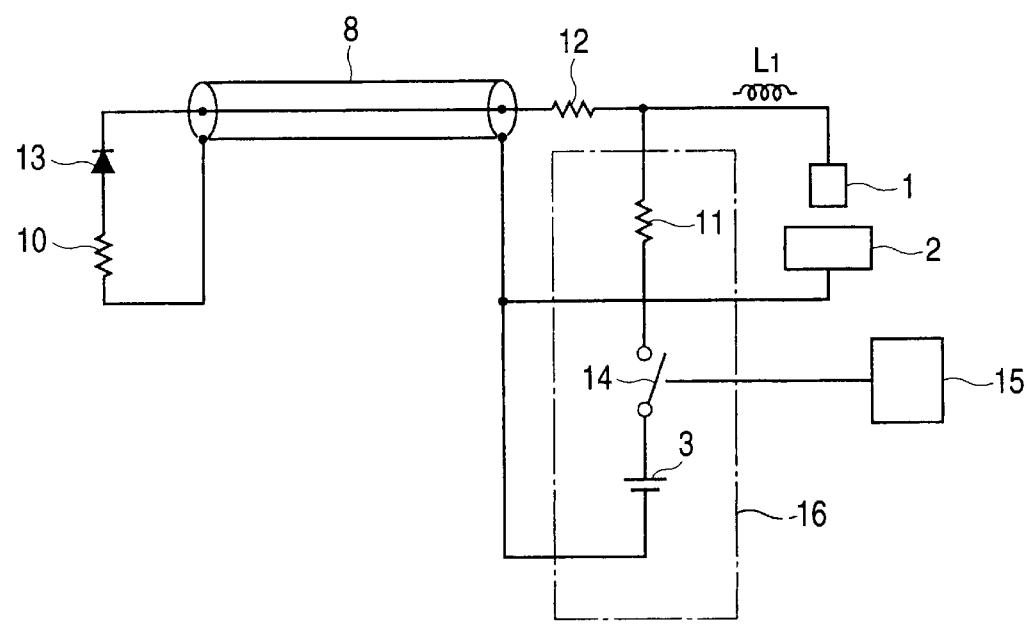
FIG. 1 is a circuit diagram to show the configuration of a discharge pulse generator according to an embodiment 1 of the invention.

FIG. 1 is a circuit diagram to show the configuration of a discharge pulse generator according to an embodiment 1 of the invention and shows an example of using the discharge pulse generator with an electric discharge machine. In the figure, numeral 1 denotes an electrode, numeral 2 denotes a workpiece, numeral 3 denotes a DC power supply, numeral 8 denotes a coaxial cable, numerals 10, 11, and 12 denote resistors, numeral 13 denotes a diode of rectification means, numeral 14 denotes switching means, numeral 15 denotes control means, numeral 16 denotes charging means for charging the coaxial cable 8, and L1 denotes an inductance of wiring; the electrode 1 and the workpiece 2 correspond to a pair of electrodes.

In FIG. 1, the current adjusting resistor 12 (resistance value R12), the electrode 1, and the workpiece 2 are connected in series to the termination of the coaxial cable 8 on the electrode 1 side (hereinafter called electrode side termination), and the connection wiring contains the inductance L1. The charging means 16 made up of the DC power supply 3, the switching means 14, and the resistor 11 (resistance value R11) is connected to the electrode side termination of the coaxial cable 8, but can be connected to any desired position such as the termination of the coaxial cable 8 on an opposite side to the electrode 1 (hereinafter called opposite side termination to the electrode). For example, if the charging means 16 is connected to the opposite side termination to the electrode of the coaxial cable 8, only the electrode 1, the workpiece 2, and the resistor 12 are connected to the electrode side termination, facilitating wiring and connection at the working time, etc.

The diode 13 connected in a direction in which no current flows relative to the voltage of the charging means 16 and the resistor 10 having a resistance value R10 set to a value equal to the characteristic impedance Z0 of the coaxial cable 8 are connected in series to the opposite side termination to the electrode of the coaxial cable 8.

If a resistor equal to the characteristic impedance Z0 is connected to the termination of the coaxial cable 8, energy of a signal propagated from an opposite end is not reflected and is all consumed in the connected resistor and the voltage applied to the resistor is a voltage having the same waveform as the voltage applied from the opposite end and with a delay as much as propagation time Td.

As an insulator in the coaxial cable 8, namely, a dielectric has a high dielectric constant, the propagation speed of electricity becomes lower. Thus, letting the ratio in which the actual length is shortened as compared with the length in a vacuum be shortening ratio k, the characteristic of the coaxial cable 8 as a distribution constant line is represented by the characteristic impedance Z0 (Ω), the shortening ratio k, and length 1 (m).

The characteristic impedance Z0 is an impedance at which the line (coaxial cable) with a distribution constant formed so that capacitance C0 and inductance L0 in the unit length of the coaxial cable 8 become $Z0=(L0/C0)^{1/2}$ (Ω) operates.

Electric length 10 (m) of the coaxial cable 8 is represented by the following expression:

$$10=1/k \tag{1}$$

The propagation time Td (s) of a signal from one end to an opposite end of the coaxial cable 8 is represented by the following expression:

$$Td=10/Cr \tag{2}$$

where Cr is the speed of light.

From expressions (1) and (2), the propagation time Td (s) is represented by the following expression:

$$Td=1/(k\,Cr) \tag{3}$$

For example, the propagation time Td of a 12.8 m coaxial cable (shortening ratio k=0.67) is $Td=12.8/(0.67\times3\times10^8)=6.37\times10^{-8}$ s=63.7 ns.

In FIG. 1, to generate a discharge pulse, the switching means 14 is turned on by the control means 15 and to stop a discharge pulse, the switching means 14 is turned off by the control means 15.

Figure 2:
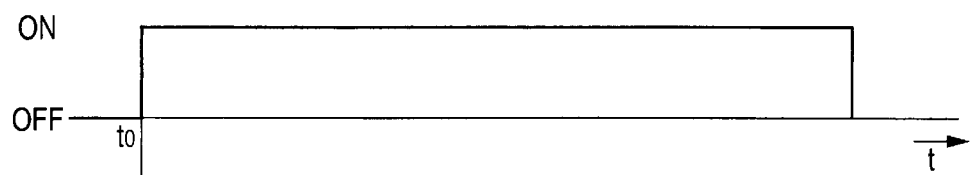
FIGS. 2(A), 2(B) and 2(C) are waveform charts to describe the operation of the discharge pulse generator according to the embodiment 1 of the invention.
Figure 2:
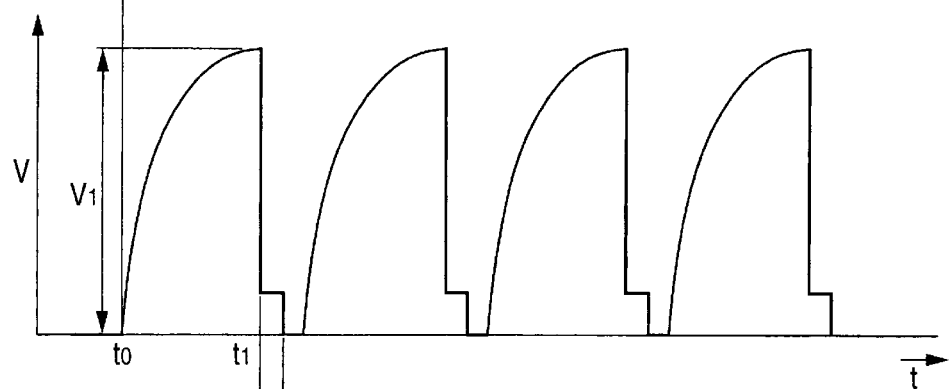
Figure 2:
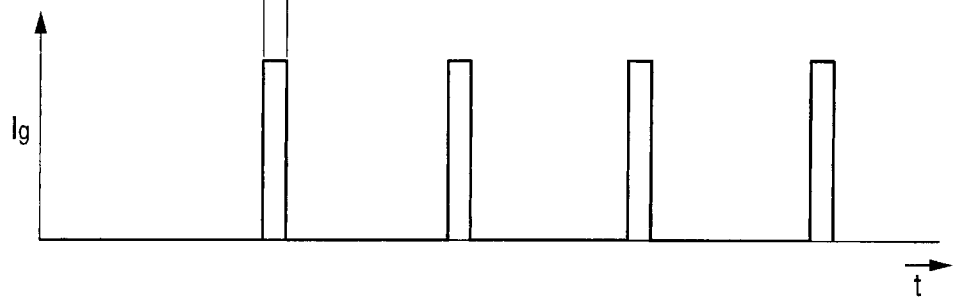

FIG. 2 is a waveform chart to describe the operation of the discharge pulse generator according to the embodiment 1 of the invention. FIG. 2(a) shows the on/off operation of the switching means 14, FIG. 2(b) shows interpole voltage V, and FIG. 2(c) shows the discharge current Ig. In the figure, t denotes a time.

At time t0 in FIG. 2(a), the switching means 14 is turned on by the control means 15 in FIG. 1 for charging the coaxial cable 8 through the resistor 11 from the DC power supply 3. The interpole voltage V rises from t0 to t1 (t1 denotes discharge start time) in FIG. 2(b) and is charged with time constant Tc=R11·C1. The capacitance C1 contains the capacitance of the coaxial cable 8, the capacitance between the electrode 1 and the workpiece 2, and the capacitance caused by wiring.

Figure 3:
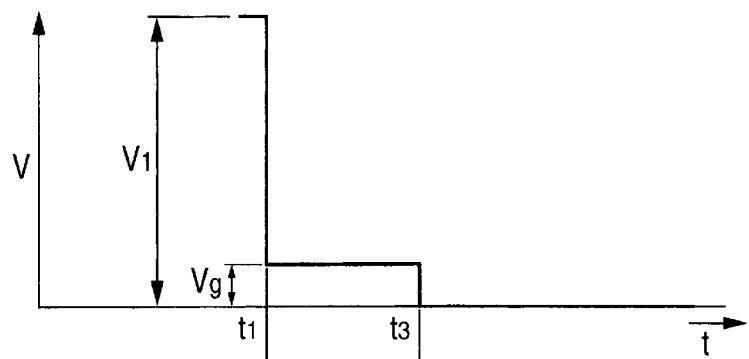
FIGS. 3(A), 3(B) and 3(C) are waveform charts to describe the operation of the discharge pulse generator according to the embodiment 1 of the invention and is a schematic representation enlarging the time axis before and after discharge start time t1.
Figure 3:
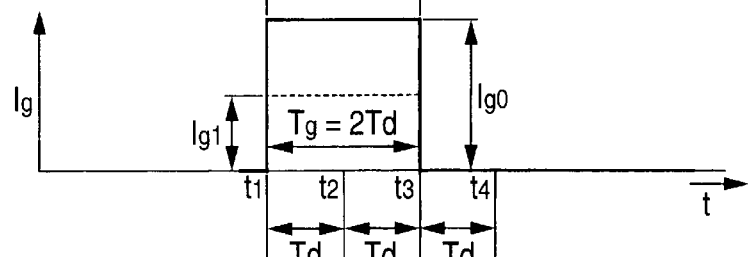
Figure 3:
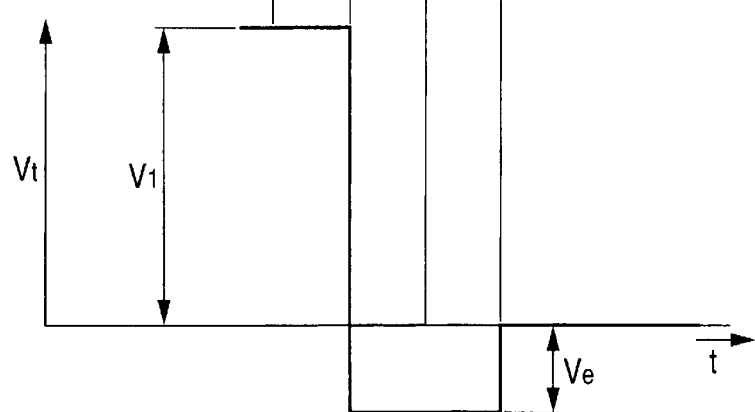

FIG. 3 is a waveform chart enlarging the time axis before and after the discharge start time t1. FIG. 3(*a*) shows interpole voltage V, FIG. 3(*b*) shows the discharge current Ig, and FIG. 3(*c*) shows voltage Vt at the opposite side termination to the electrode of the coaxial cable 8. In the figure, t denotes a time.

The coaxial cable 8 is charged to voltage V1 just before the discharge start time t1 in FIG. 3. When discharge occurs at the time t1, the interpole voltage V becomes discharge voltage Vg and becomes almost constant, for example, about 20 to 30 V during the charging. The discharge current Ig rises steeply as shown in FIGS. 2(*c*) and 3(*b*) and a pulse current like a rectangular wave occurs.

The discharge current Ig (A) becomes a value resulting from dividing voltage drop (V1−Vg) by circuit impedance (Z0+R12), namely, is represented by the following expression:

$$Ig=(V1-Vg)/(Z0+R12) \quad (4)$$

In the discharge current waveform in FIG. 3(*b*), the discharge current pulse when the resistance value R12 of the resistor 12 is 0 is indicated by Ig0 (solid line) and the discharge current pulse when the resistance value R12 is the same as the characteristic impedance Z0 of the coaxial cable 8 is indicated by Ig1 (dashed line). Only the peak value of the discharge current pulse changes depending the magnitude of the resistance vale R12 of the resistor 12 and the pulse width is Tg (=2Td) and does not change.

When the voltage V1 at the electrode side termination of the coaxial cable 8 lowers to the discharge voltage Vg because of discharge occurrence at the time t1, the voltage Vt at the opposite side termination to the electrode of the coaxial cable 8 is changed from V1 to Ve=−(V1−2Vg)/2 (V) as shown in FIG. 3(*c*) at the time t2 after the propagation time Td of the coaxial cable 8.

The negative voltage Ve occurs as the voltage drop (V1−Vg) caused by discharge propagates from the electrode side termination of the coaxial cable 8 to the opposite side termination to the electrode. Electric current flows into the resistor 10 from time t2 to time t4 during which the voltage Vt at the opposite side termination to the electrode of the coaxial cable 8 is negative, and all energy is consumed. Therefore, the energy propagating from the opposite side termination to the electrode to the electrode side termination becomes 0, namely, voltage 0 and current 0 are propagated to the electrode side termination.

At time t3 after the additional propagation time Td from the time t2, the discharge current Ig becomes 0 steeply and the interpole voltage V also becomes 0. At this time, the discharge between the electrode 1 and the workpiece 2 is arc-extinguished and the electrode 1 enters an open state.

Since the voltage of the electrode 1 becomes 0, the voltage Vt at the opposite side termination to the electrode of the coaxial cable 8 becomes 0 and the voltage and current become the initial state of 0 at time t4 after the additional propagation time Td. Such operation is made possible if the resistance value R11 of the resistor 11 of the charging means 16 is a comparatively large value relative to the characteristic impedance Z0 with the switching means 14 turned on. That is, the operation is possible if the resistance value R11 is roughly 10 times or more the characteristic impedance Z0 of the coaxial cable 8.

For example, if the resistance value R11 is set to roughly 10 times or more the characteristic impedance Z0 of the coaxial cable 8, when the coaxial cable 8 is RG-58C/U (the characteristic impedance is 50 Ω), the length 1 is 12.8 m, the voltage of the DC power supply 3 is 120 V, and the discharge voltage Vg is 20 V, a pulse with the pulse width Tg about 136 ns and the discharge current Ig 2 A is provided.

Likewise, if the resistance value R11 is set to roughly 10 times or more the characteristic impedance Z0 of the coaxial cable 8, when the coaxial cable 8 is 3C-2V (the characteristic impedance is 75 Ω), the length 1 is 1 m, the voltage of the DC power supply 3 is 120 V, and the discharge voltage V is 25 V, a very short pulse with the pulse width Tg about 16 ns and the discharge current Ig 1.2 A is provided.

As described above, the fact that the interpole voltage V can be set to 0 at the time t3 and later in FIG. 3(*a*) is ideal as the discharge pulse generator; however, the voltage may not always become 0 depending on the application. For example, if the discharge pulse generator is used with an electric discharge machine, the interpole voltage V may become equal to or less than the discharge voltage at the time t3 and later.

According to the described configuration, a discharge pulse generator capable of generating a current pulse like a rectangular wave of the discharge current Ig with the pulse width Tg twice the propagation time Td of the coaxial cable 8 can be provided. The resistance value R12 of the resistor 12 is made variable with the resistor 12 as a variable resistor, whereby the peak value of the discharge current pulse can be set to any desired value without changing the pulse width.

Since the electrode 1 becomes an open state at the termination time of a discharge current pulse generated by the discharge pulse generator according to the invention, the charging means 16 starts charging and charging and discharging are repeated as in FIG. 2(*b*) and FIG. 2(*c*). If the switching means 14 of the charging means 16 is thus turned on by the control means 15 (FIG. 2(*a*)), discharge pulses can be generated continuously (group discharge).

The repetition period of the group discharge is determined by the discharge start voltage V1 at the time t1, the voltage of the DC power supply 3 and the resistance value R11 of the resistor 11 of the charging means, and the capacitance of the coaxial cable 8 and the electrode 1. When the capacitance is 100 pF and the resistance value R11 is 1 kΩ, repetitive discharge (group discharge) is possible at a high frequency of about 3 MHz.

If the switching means 14 is turned off by the control means 15, charging is stopped and thus generation of discharge pulses is also stopped. The switching means 14 can be simply implemented as a relay, a semiconductor, or the like and turning on/off a discharge pulse can be easily controlled.

To use the discharge pulse generator according to the embodiment 1 of the invention with an electric discharge machine, generally the electric discharge machine performs so-called jump operation of reciprocating the electrode 1 relative to the workpiece 2 intermittently at high speed and works on the workpiece 2 while discharging work chippings between the poles. If the switching means 14 is controlled by the control means 15 in synchronization with the jump operation, a discharge current pulse can be generated in the optimum work condition. The switching means is turned on intermittently during the working, whereby the stable working condition can be maintained.

As described above, the discharge pulse generator according to the invention can supply a discharge current pulse with a predetermined pulse width and peak value and can produce group discharge at a predetermined repetitive frequency according to the very simple configuration.

The discharge pulse generator according to the invention has the simple configuration and can be miniaturized and thus can be placed in the proximity of a pair of electrodes. Therefore, the wiring can be shortened, so that the inductance of the wiring can be decreased and the workpiece can be worked on with higher accuracy and higher quality at higher speed in electric discharge machining using the discharge pulse generator.

The description given above is based on the circuit configuration in FIG. 1 as the discharge pulse generator according to the invention, but the invention is not limited to the circuit configuration in FIG. 1.

For example, a configuration wherein the DC power supply 3 of the charging means 16 and the diode 13 are connected in an opposite direction may be adopted, in which case the polarity of the voltage is reversed, but operation equal to that in FIG. 1 can be performed.

The case wherein the charging means 16 is made up of the DC power supply 3, the switching means 14, and the resistor 11 has been described, but the charging means is not limited to such a configuration and may be a constant current source, etc.

In FIG. 1, the case wherein the number of the coaxial cables 8 is one has been described, but a plurality of coaxial cables may be connected in parallel, in which case the characteristic impedance of the distribution constant line can be lowered and thus the peak value of a discharge current pulse can be more raised.

In FIG. 1, the coaxial cables 8 is used as the distribution constant line, but a twisted pair maybe used as the distribution constant line. The twisted pair can be implemented as normal insulated wire and can be manufactured easily at low costs. However, the characteristic impedance Z0 is high as compared with that of a coaxial cable and thus the peak value of a discharge current pulse becomes low as compared with that of the coaxial cable.

The distribution constant line may be formed by surrounding a copper foil line of a predetermined length by a print pattern on a printed board rather than the coaxial cable or twisted pair. In this case, more miniaturization and cost reduction can be accomplished.

Embodiment 2

Figure 4:
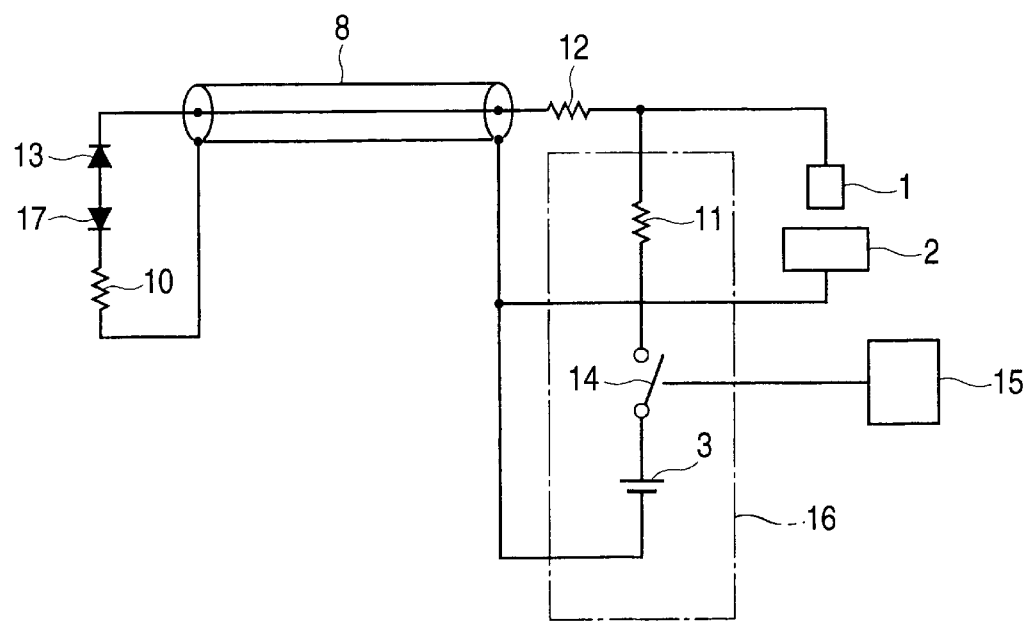
FIG. 4 is a circuit diagram to show the configuration of a discharge pulse generator according to an embodiment 2 of the invention.

FIG. 4 is a circuit diagram to show the configuration of a discharge pulse generator according to an embodiment 2 of the invention. Parts identical with or similar to those in FIG. 1 in the embodiment 1 are denoted by the same reference numerals in FIG. 4. In FIG. 4, numeral 17 denotes a Zener diode, which is connected in an opposite direction to a diode 13.

Figure 5:
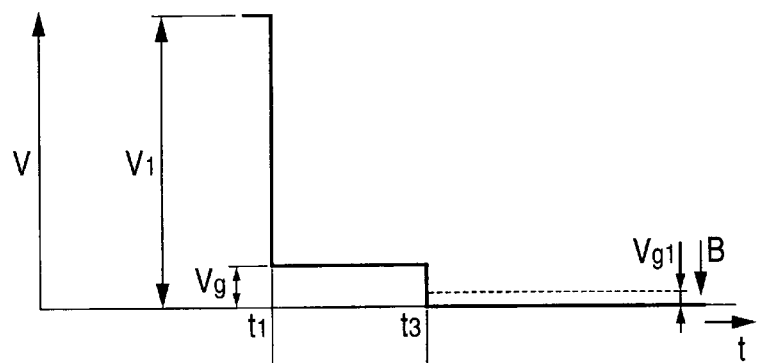
FIGS. 5(A), 5(B) and 5(C) are waveform charts to describe the operation of the discharge pulse generator according to the embodiment 2 of the invention and is a schematic representation enlarging the time axis before and after discharge start time t1.
Figure 5:
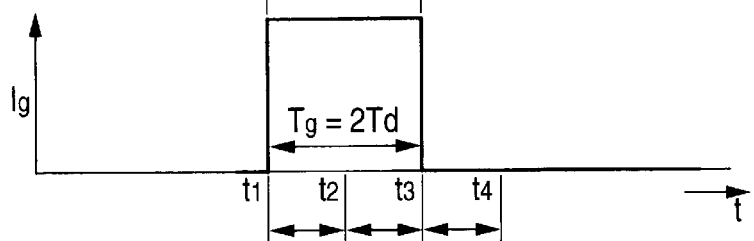
Figure 5:
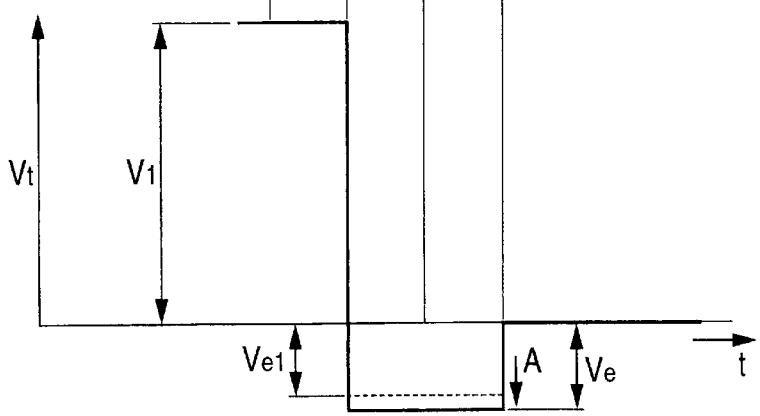

FIG. 5 is a waveform chart to describe the operation of the discharge pulse generator according to the embodiment 2 of the invention and is a schematic representation enlarging the time axis before and after discharge start time t1. In the figure, t denotes a time.

If the resistance value R11 of the resistor 11 in FIG. 1 is lessened for increasing the charge current in order to shorten the charging time in FIG. 2 (t0 to t1) in the configuration of the embodiment 1, the voltage Vt at the opposite side termination to the electrode of the coaxial cable 8 changes from Ve to Ve1 (dashed line) as in FIG. 5(c) and the interpole voltage V does not become 0 at the time t3 or later and voltage Vg1 (dashed line) occurs as in FIG. 5(a).

Such voltage Vg1 may introduce a problem depending on the application of the discharge pulse generator; for example, to use the discharge pulse generator with an electric discharge machine, it is necessary to suppress to the discharge voltage or less.

FIG. 4 shows a configuration example to set such voltage Vg1 to 0 as an example. A constant voltage source is implemented as the Zener diode 17 and the voltage Ve1 in FIG. 5 becomes Ve as indicated by arrow A in FIG. 5(c) because of the Zener voltage of the Zener diode 17 and the voltage Vg1 can be set to 0 as indicated by arrow B in FIG. 5(a). The Zener voltage of the Zener diode 17 becomes about 5 V, for example, when a coaxial cable 8 is RG-58C/U (the characteristic impedance is 50 Ω), the voltage of a DC power supply 3 is 120 V, and the resistance value R11 of a resistor 11 is 1 kΩ.

The Zener voltage is changed in response to the application, for example, wherein the voltage Vg1 need not be 0, etc., whereby the voltage Vg1 can be suppressed within any desired voltage limit range.

According to the described configuration, the function and effect similar to those of the embodiment 1 can be provided and the resistance value R11 of the resistor 11 for determining the output current from charging means 16 can be lessened for increasing the output current from the charging means 16 for shortening the charging time, so that a discharge current pulse at a high repetition frequency as compared with that in FIG. 2 in the embodiment 1 can be generated.

In the configuration example in FIG. 4 in the description given above, the constant voltage source is implemented as the Zener diode 17, but a constant voltage source implemented as any other component such as a transistor may be used.

Embodiment 3

Figure 6:
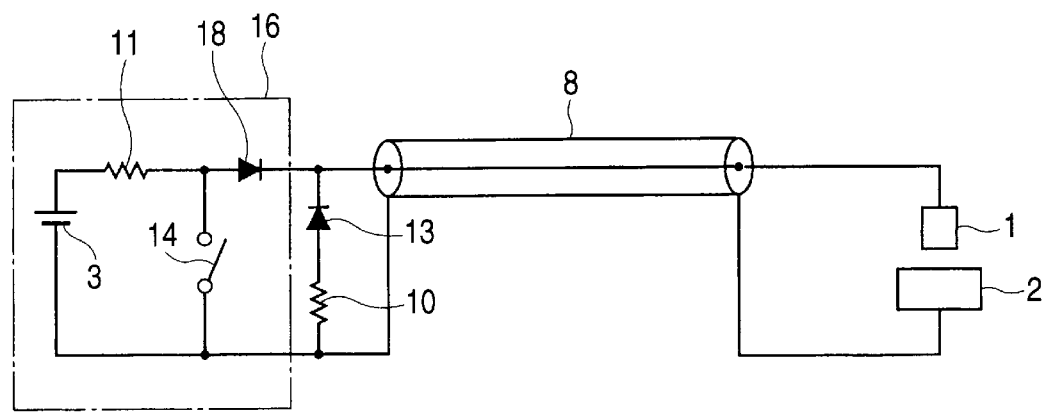
FIG. 6 is a circuit diagram to show the configuration of a discharge pulse generator according to an embodiment 3 of the invention.

FIG. 6 is a circuit diagram to show the configuration of a discharge pulse generator according to an embodiment 3 of the invention. Parts identical with or similar to those in FIG. 1 in the embodiment 1 are denoted by the same reference numerals in FIG. 6. In FIG. 6, numeral 18 denotes a diode, and charging means 16 is a series body of a DC power supply 3, a resistor 11, and the diode 18 connected in a charging direction with switching means 14 connected in parallel with the DC power supply 3 and the resistor 11. If the switching means 14 is turned off by control means (not shown), charging can be started and if the switching means 14 is turned on by the control means (not shown), the charging can be stopped; the function and effect similar to those of the embodiment 1 can be provided.

Embodiment 4

Figure 7:
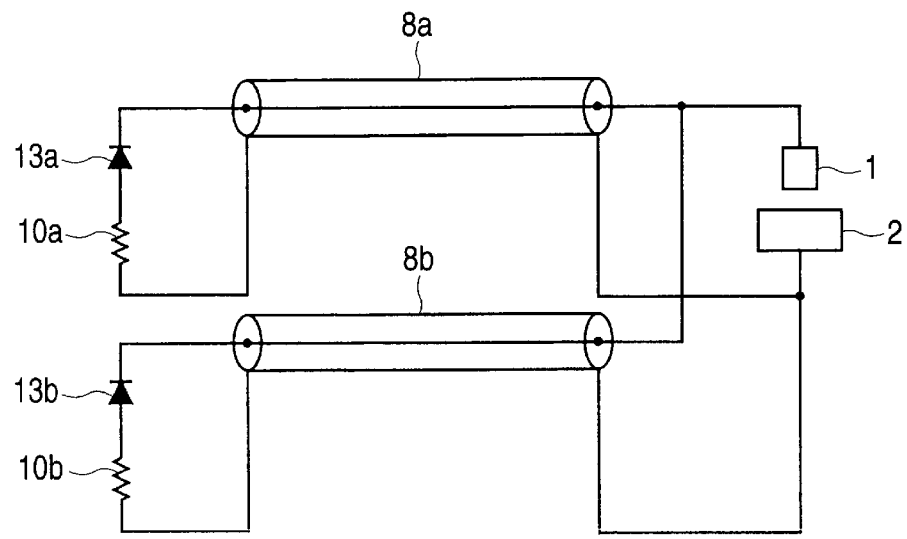
FIG. 7 is a circuit diagram to show the configuration of a discharge pulse generator according to an embodiment 4 of the invention.

FIG. 7 is a circuit diagram to show the configuration of a discharge pulse generator according to an embodiment 4 of the invention. Parts identical with or similar to those in FIG. 1 in the embodiment 1 are denoted by the same reference numerals in FIG. 7. In FIG. 7, numerals 8a and 8b denote coaxial cables, numerals 10a and 10b denote resistors, and numeral 13a and 13b denote diodes, and charging means having a similar function to that of the charging means 16 in FIG. 1 in the embodiment 1 and connected to any of lines connected to an electrode 1 is omitted.

In FIG. 7, a circuit made up of the coaxial cable 8a, the diode 13a, and the resistor 10a and a circuit made up of the coaxial cable 8b, the diode 13b, and the resistor 10b are in parallel and connected to the electrode 1 and a workpiece 2, and the total value of currents of the parallel circuits flows into the electrode 1. A current adjusting resistor may be inserted into at least either of the parallel circuits as required.

The discharge pulse generator according to the embodiment 4 of the invention can provide the function and effect similar to those of the embodiment 1 and in addition, for example, if the characteristic impedance of the coaxial cable 8b is raised relative to the coaxial cable 8a, the peak current value supplied by the coaxial cable 8b is lowered and if the length of the coaxial cable 8b is increased relative to the coaxial cable 8a, the current of the coaxial cable 8b terminates after the current of the coaxial cable 8a terminates, and the discharge current can be changed at two steps. In such a configuration, for example, to use the discharge pulse generator according to the embodiment 4 of the invention for electric discharge machining, the first current at the start of discharge is held high for stably continuing the discharge and next a weak current is used for electric discharge machining, whereby high-quality working with smoother surface roughness can be accomplished.

Embodiment 5

Figure 8:
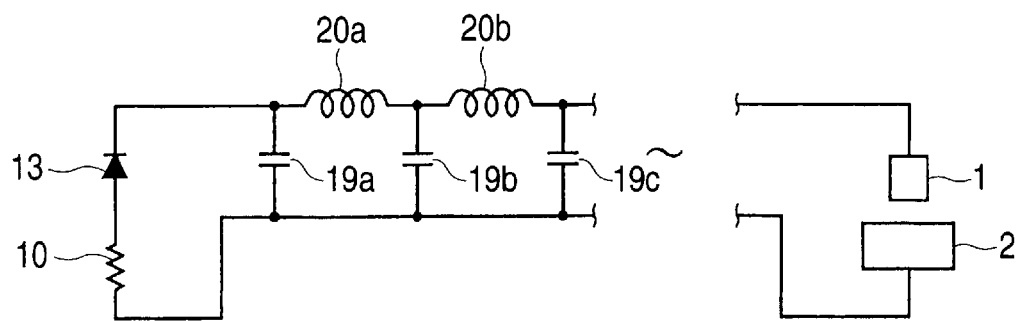
FIG. 8 is a circuit diagram to show the configuration of a discharge pulse generator according to an embodiment 5 of the invention.

FIG. 8 is a circuit diagram to show the configuration of a discharge pulse generator according to an embodiment 5 of the invention. Parts identical with or similar to those in FIG. 1 in the embodiment 1 are denoted by the same reference numerals in FIG. 8. In FIG. 8, numerals 19a, 19b, and 19c denote resistors and numeral 20a and 20b denote inductors, and charging means having a similar function to that of the charging means 16 in FIG. 1 in the embodiment 1 and connected to any of lines connected to an electrode 1 is omitted.

In the configuration in FIG. 8, the coaxial cable 8 in FIG. 1 in the embodiment 1 is made a repetition circuit of discrete capacitors (19a, etc.,) and inductors (20a, etc.,) forming a characteristic impedance equal to the characteristic impedance of the coaxial cable 8, and the function and effect similar to those of the embodiment 1 can be provided and the discharge pulse generator can be miniaturized.

Embodiment 6

Figure 9:
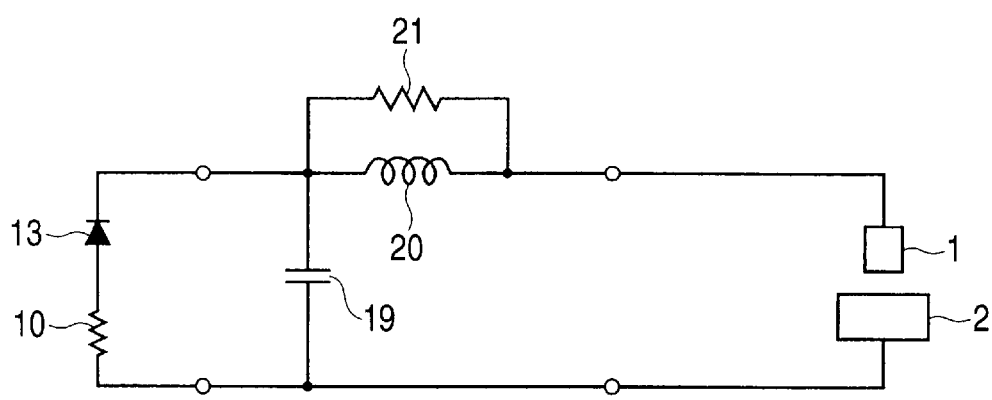
FIG. 9 is a circuit diagram to show the configuration of a discharge pulse generator according to an embodiment 6 of the invention.

FIG. 9 is a circuit diagram to show the configuration of a discharge pulse generator according to an embodiment 6 of the invention. Parts identical with or similar to those in FIG. 8 in the embodiment 5 are denoted by the same reference numerals in FIG. 9.

In the configuration in FIG. 9, the circuit consisting of the discrete capacitors and inductors in the configuration in FIG. 8 in the embodiment 5 is made only one circuit and a parallel resistor to the inductance is added. That is, in FIG. 9, numeral 19 denotes a capacitor (capacitance C19) and numeral 20 denotes an inductor (inductance L20) and a resistor 21 of a resistance value R21 equal to characteristic impedance $Z1=(L20/C19)^{1/2}$ ($\Omega$) is added in parallel to the inductor 20. Charging means having a similar function to that of the charging means 16 in FIG. 1 in the embodiment 1 and connected to any of lines connected to an electrode 1 is omitted.

Figure 10:
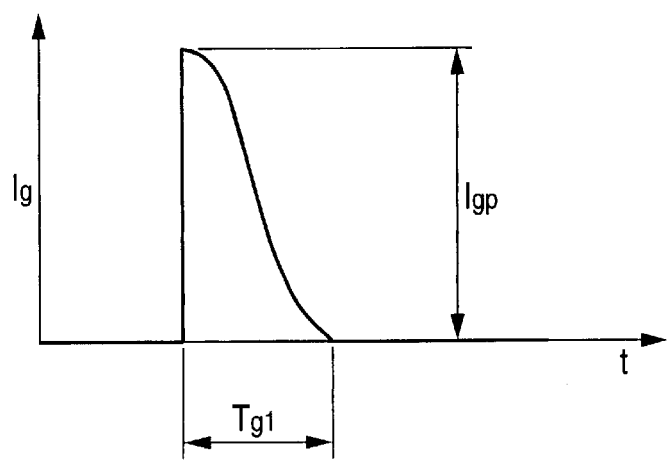
FIG. 10 shows a discharge current waveform in the discharge pulse generator according to the embodiment 6 of the invention.

FIG. 10 shows a discharge current Ig in the discharge pulse generator according to the embodiment 6 of the invention. In the figure, t denotes a time. A pulse width Tg1 becomes about a quarter the resonance period based on the inductance L20 and the capacitance C19. A peak value of the discharge current, Igp, is Igp=V1/Z1 (A) (V1 is discharge start voltage), and the discharge pulse generator capable of generating a discharge current waveform of a single pulse whose rising edge is steep unlike simple capacitor discharge can be miniaturized.

For example, if the capacitance C19 is set to 811 pF, the inductance L20 is set to 2028 nH, the resistance value R21 is set to 50 $\Omega$, the resistance value R10 is set to 50$\Omega$, and the voltage of a DC power supply 3 is 120 V, a discharge current pulse with the pulse width Tg1 100 ns and the peak value Igp 2 A can be provided.

Embodiment 7

Figure 11:
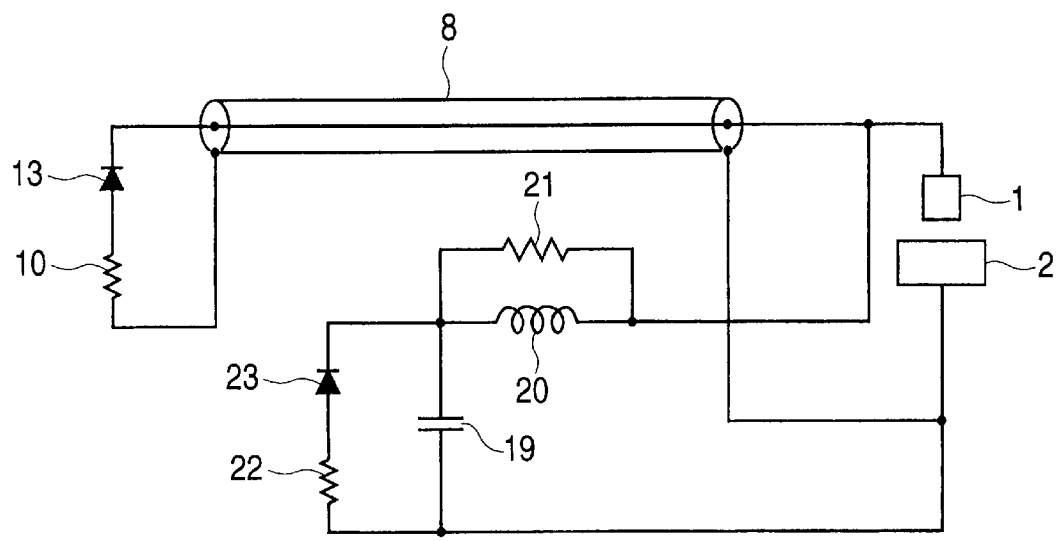
FIG. 11 is a circuit diagram to show the configuration of a discharge pulse generator according to an embodiment 7 of the invention.

FIG. 11 is a circuit diagram to show the configuration of a discharge pulse generator according to an embodiment 7 of the invention. Parts identical with or similar to those in FIG. 1 in the embodiment 1 and in FIG. 9 in the embodiment 6 are denoted by the same reference numerals in FIG. 11. In FIG. 11, numeral 22 denotes a resistor and numeral 23 denotes a diode, and charging means having a similar function to that of the charging means 16 in FIG. 1. in the embodiment 1 and connected to any of lines connected to an electrode 1 is omitted.

In FIG. 11, the configuration of the opposite side termination to an electrode of a coaxial cable 8 is the same as that in FIG. 1 and a similar circuit to that in FIG. 9 in the embodiment 6 is added to the electrode side termination of the coaxial cable 8; the configuration in FIG. 1 in the embodiment 1 and the configuration in FIG. 9 in the embodiment 6 are used in combination.

Figure 12:
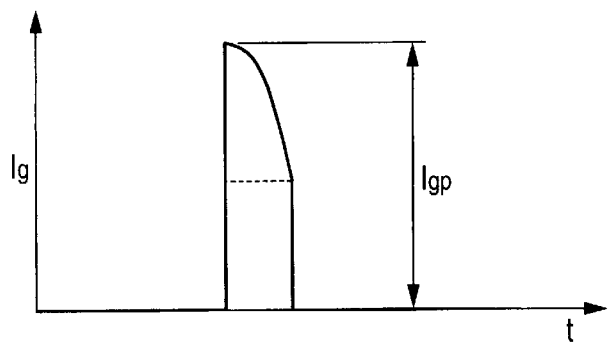
FIG. 12 shows a discharge current waveform in the discharge pulse generator according to the embodiment 7 of the invention.

FIG. 12 shows a discharge current Ig in the discharge pulse generator according to the embodiment 7 of the invention and shows the case where the propagation time of the coaxial cable 8 and that of the similar circuit to that in FIG. 9 are set the same. In the figure, t denotes a time. Thus, discharge current pulse Ig rising fast and having a high peak value Igp that cannot be provided in the configuration of the coaxial cable 8 only can be provided.

Embodiment 8

Figure 13:
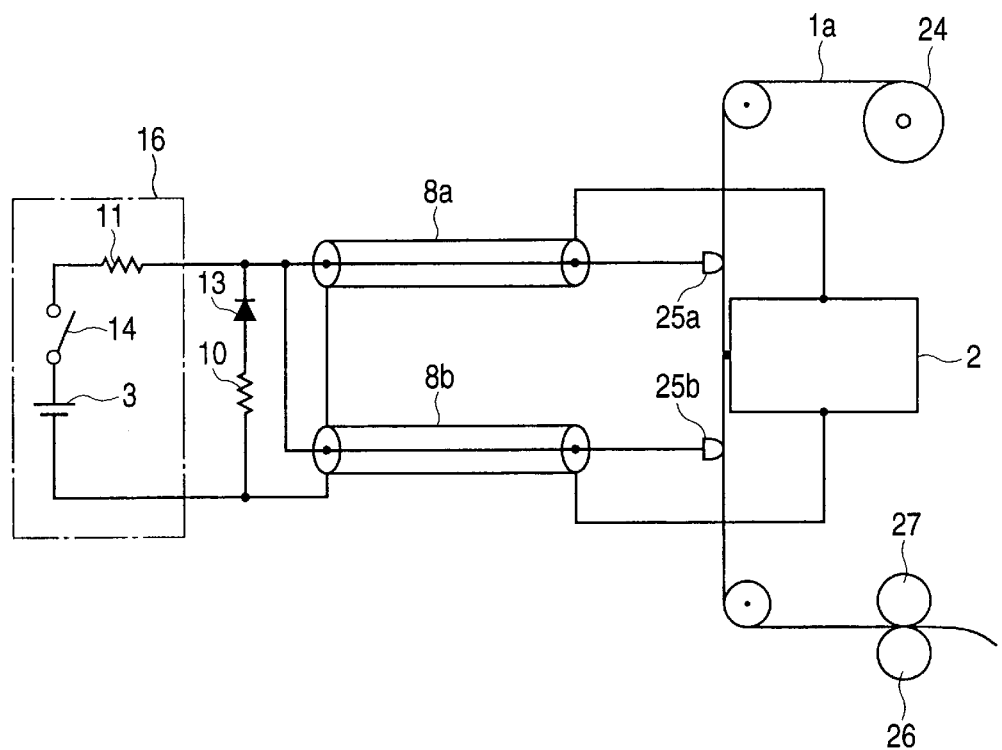
FIG. 13 is a circuit diagram to show the configuration of a discharge pulse generator according to an embodiment 8 of the invention.

FIG. 13 is a circuit diagram to show the configuration of a discharge pulse generator according to an embodiment 8 of the invention and shows an example of applying the discharge pulse generator to a wire electric discharge machine for performing fine finishing work. Parts identical with or similar to those in FIG. 1 in the embodiment 1 are denoted by the same reference numerals in FIG. 13. In FIG. 13, numeral 1a denotes a wire electrode, numerals 8a and 8b denote coaxial cables, numeral 24 denotes a wire bobbin, numeral 25a denotes an upper feeding part, numeral 25b denotes a lower feeding part, numeral 26 denotes a capstan roller, and numeral 27 denotes a pinch roller. Only an outline of the configuration of the wire electric discharge machine is shown.

One conductors at the electrode side terminations of the coaxial cables 8a and 8b are connected to the upper feeding part 25a and the lower feeding part 25b. Other conductors at the electrode side terminations of the coaxial cables 8a and 8b are connected to a workpiece 2. The opposite side terminations to the electrodes of the coaxial cables 8a and 8b are connected in parallel.

The wire electric discharge machine clamps and pulls the wire electrode 1a by the capstan roller 26 and the pinch roller 27, supplies work power between the workpiece 2 and the wire electrode 1a from the discharge pulse generator while running the wire electrode 1a, and works on the workpiece 2 while relatively moving the wire electrode 1a and the workpiece 2 by positioning means (not shown).

If the upper feeding part 25a and the lower feeding part 25b are at a distance from each other, wiring between the electrode side terminations of the coaxial cables 8a and 8b and the upper feeding part 25a and the lower feeding part 25b can be made short, so that a fine discharge current pulse with a short pulse width can be supplied.

A common diode 13 and a common resistor 10 can be used at the opposite side terminations to the electrodes of the coaxial cables 8a and 8b if the coaxial cables are long to some extent. Charging means 16 is placed at the opposite side terminations to the electrodes of the coaxial cables 8a and 8b, whereby turning on/off of discharge can be controlled at a position at a distance as much as the lengths of the coaxial cables 8a and 8b from the wire electrode 1a and the workpiece 2.

Embodiment 9

Figure 14:
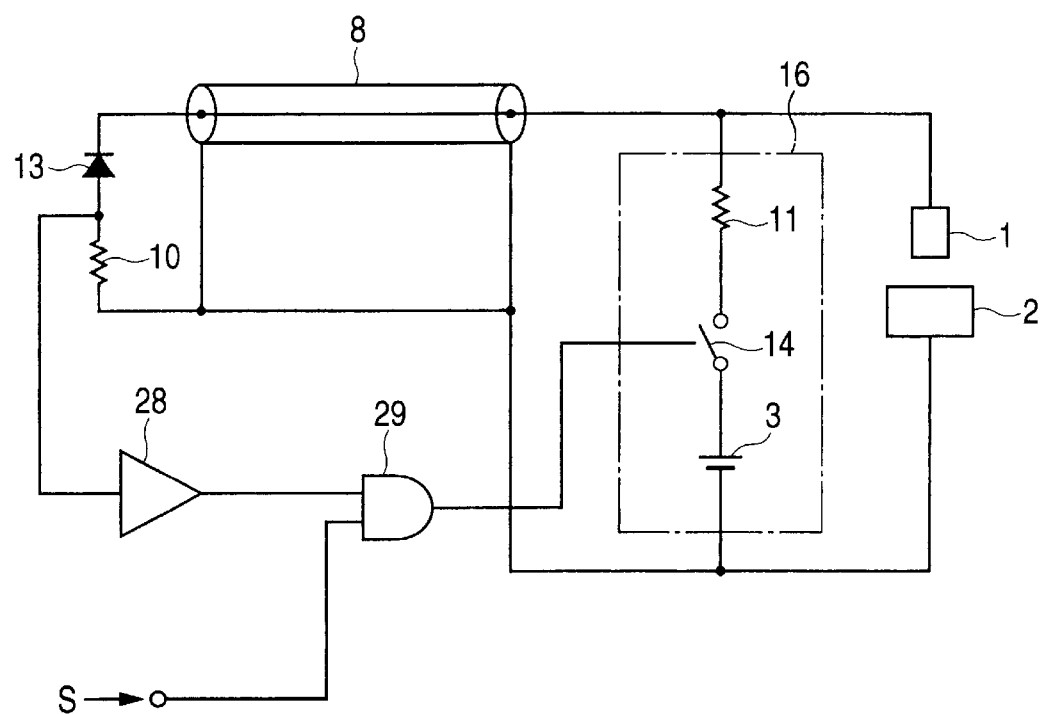
FIG. 14 is a circuit diagram to show the configuration of a discharge pulse generator according to an embodiment 9 of the invention.

FIG. 14 is a circuit diagram to show the configuration of a discharge pulse generator according to an embodiment 9 of the invention. Parts identical with or similar to those in FIG. 1 in the embodiment 1 are denoted by the same reference numerals in FIG. 14. In FIG. 14, numeral 28 denotes voltage detection and polarity determination means, numeral 29 denotes an AND circuit, and S denotes a discharge turning on/off signal.

In the embodiment 9, like the embodiment 2, means capable of lessening a resistance value R11 of a resistor 11 for determining the output current from charging means 16, thereby shortening the charging time and generating a discharge current pulse at a high repetition frequency is shown.

The voltage detection and polarity determination means 28 has a function of detecting the voltage of a resistor 10 and a function of comparing the voltage detection value with a zero voltage, for example, and determining the voltage polarity of the resistor 10.

In FIG. 14, the voltage of the resistor 10 connected to the opposite side termination to an electrode of a coaxial cable 8 is detected by the voltage detection and polarity determination means 28 and if it is determined that the polarity of the voltage of the resistor 10 becomes opposite to the polarity just before discharge, switching means 14 of charging means 16 is turned off. The switching means 14 corresponds to charging stop means.

The switching means 14 can also be turned on/off by the discharge turning on/off signal S and turning on/off of discharge can be controlled.

Figure 15:
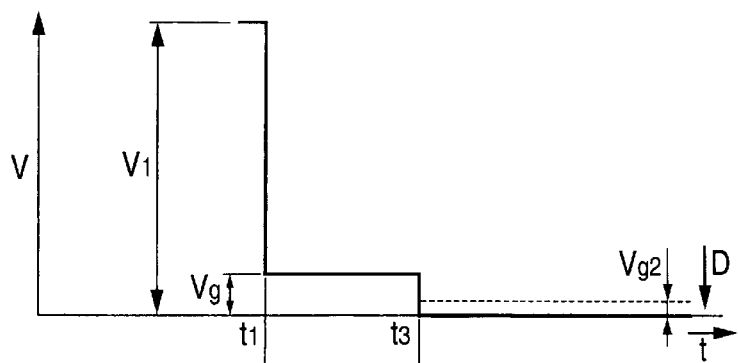
FIGS. 15(A), 15(B), 15(C) and 15(D) are waveform charts to describe the operation of the discharge pulse generator according to the embodiment 9 of the invention and is a schematic representation enlarging the time axis before and after discharge start time t1.
Figure 15:
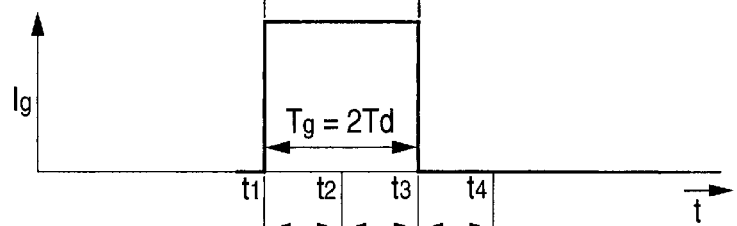
Figure 15:
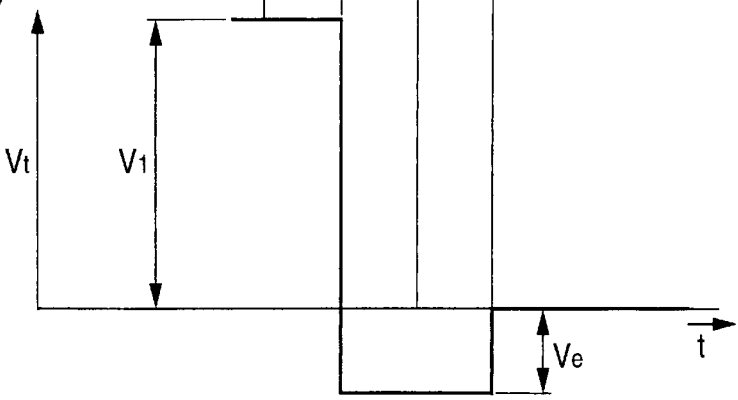
Figure 15:
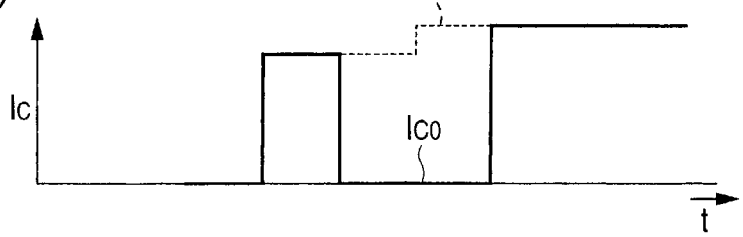

FIG. 15 is a waveform chart to describe the operation of the discharge pulse generator according to the embodiment 9 of the invention and is a schematic representation enlarging the time axis before and after discharge start time t1 like that in FIG. 3 in the embodiment 1. Contents identical with those in FIG. 3 in the embodiment 1 are denoted by the same symbols in FIG. 15. FIG. 15(d) shows output current from the charging means 16 (namely, current passing through the resistor R11) Ic.

Voltage Vt at the opposite side termination to the electrode of the coaxial cable 8 in FIG. 15(c) becomes voltage Ve of an opposite polarity to that of voltage V1 before discharge start from time t2 to time t4. This voltage Ve is detected by the voltage detection and polarity determination means 28 and a signal for turning off the switching means 14 from time t2 to time t4 is output through the AND circuit 29.

The switching means 14 of charging stop means is thus turned off, whereby output current Ic from the charging means 16 becomes 0 (Ic0) from time t2 to time t4 as in FIG. 15(d). If the switching means 14 is not turned off from time t2 to time t4, the output current Ic from the charging means 16 continues as Ic1 (dashed line) and thus a voltage occurs at the discharge pulse termination time as Vg2 in FIG. 15(a), but the voltage Vg2 at the discharge pulse termination time can be set to 0 (arrow D in FIG. 15(a)) by turning off the output current Ic from the charging means 16 from time t2 to time t4 as Ic0 in FIG. 15(d). Therefore, the resistance value R11 of the resistor 11 for determining the output current Ic from the charging means 16 can be lessened for increasing the output current Ic from the charging means 16 for accelerating the charging, so that a discharge current pulse at a high repetition frequency as compared with that in FIG. 2 in the embodiment 1 can be generated.

Figure 16:
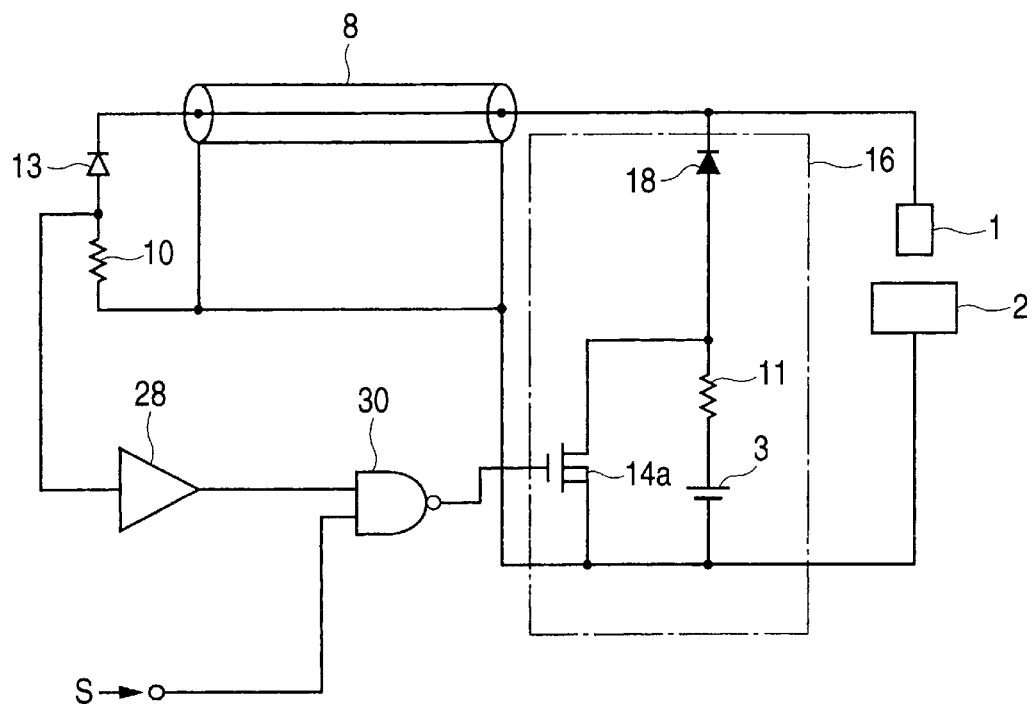
FIG. 16 is a circuit diagram to show another configuration of the discharge pulse generator according to the embodiment 9 of the invention.
Figure 17:
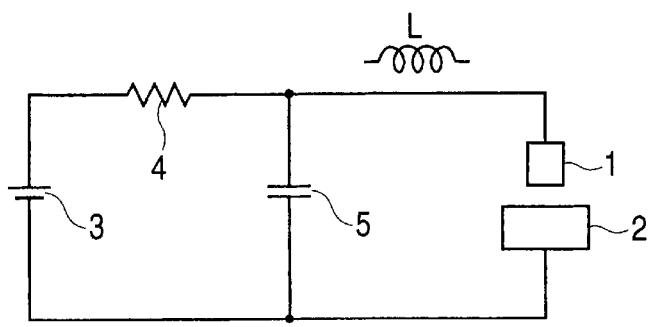
FIG. 17 is a circuit diagram to show the configuration of a discharge pulse generator in a related art.
Figure 18:
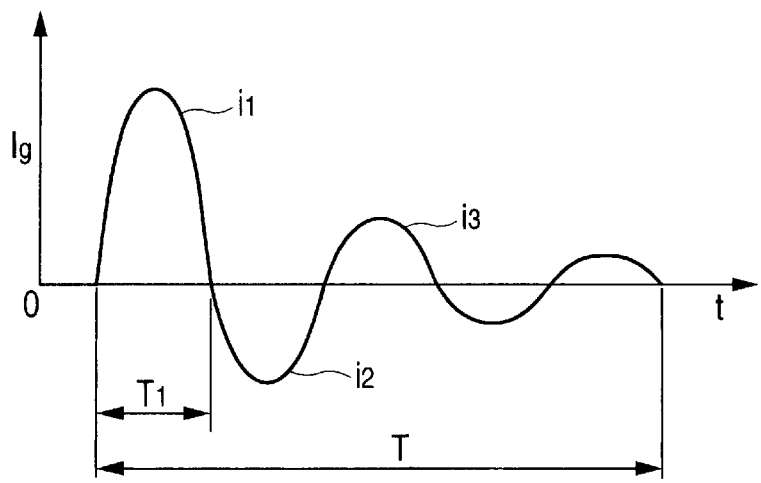
FIG. 18 is a schematic representation to show an example of a damped vibration waveform of discharge current caused by LC oscillation in the discharge pulse generator in the related art in FIG. 17.
Figure 19:
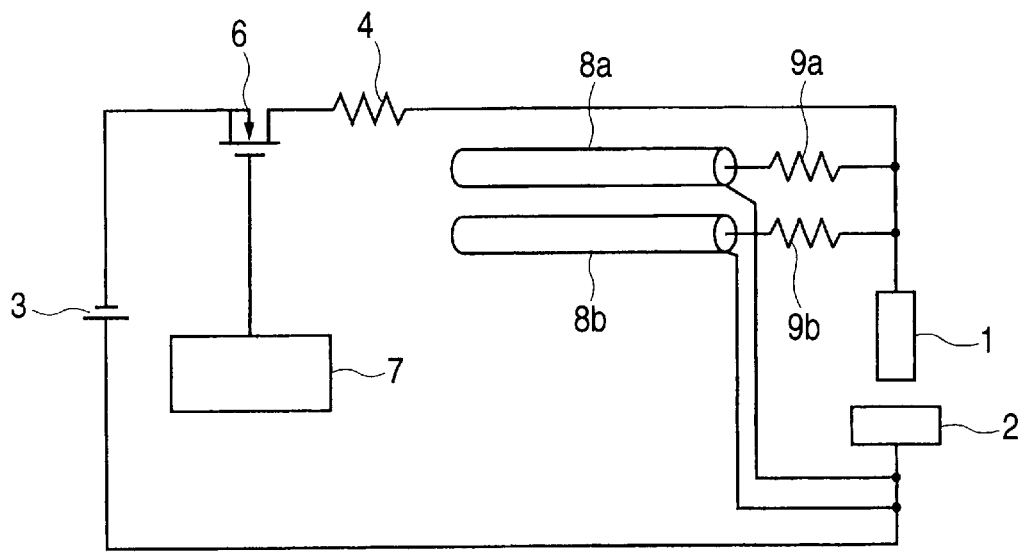
FIG. 19 is a circuit diagram to show the configuration of another discharge pulse generator in a related art.
Figure 20:
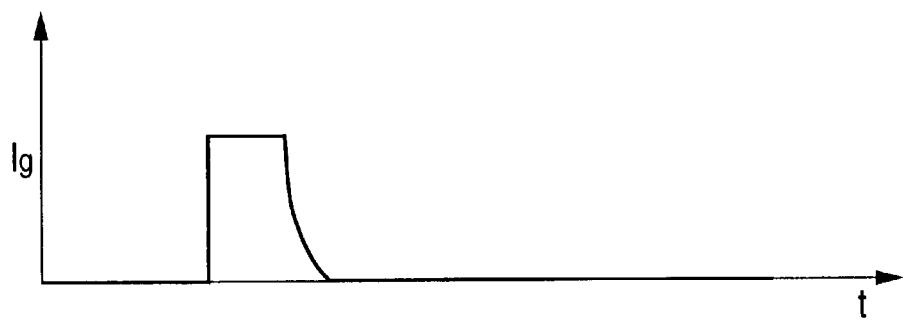
FIGS. 20(A) and 20(B) are drawings to show an example of discharge current between an electrode and a workpiece in the discharge pulse generator in the related art in FIG. 19.
Figure 20:
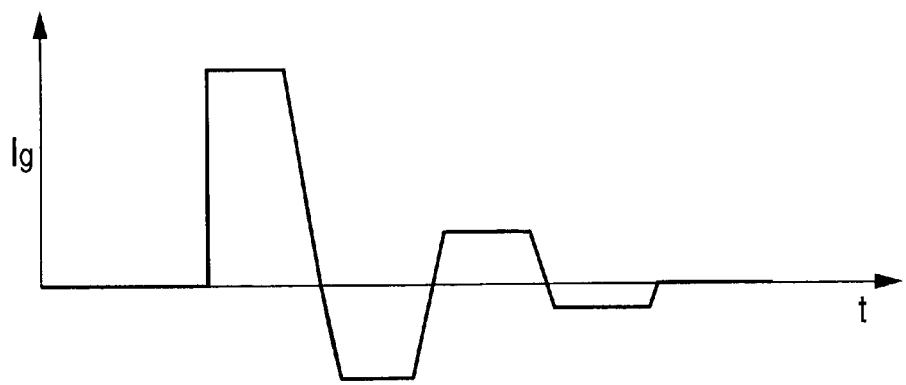

FIG. 16 is a circuit diagram to show another configuration of the discharge pulse generator according to the embodiment 9 of the invention. Parts identical with or similar to those in FIG. 14 are denoted by the same reference numerals in FIG. 16. In FIG. 16, numeral 14a denotes an FET of switching means and numeral 30 denotes a NAND circuit. Charging means 16 has a similar configuration to that in FIG. 6 in the embodiment 3 and charging can be started by turning off the FET 14a and can be stopped by turning on the FET 14a. The voltage of a resistor 10 is detected by voltage detection and polarity determination means 28 and if it is determined that the polarity of the voltage of the resistor 10b becomes opposite to the polarity just before discharge, the FET 14a is turned on, stopping the charge current. The FET 14a corresponds to charging stop means.

Turning on/off of discharge can also be controlled by a discharge turning on/off signal S.

The function and effect of the discharge pulse generator having the configuration in FIG. 16 are similar to those of the discharge pulse generator in FIG. 15.

Industrial Applicability

As described above, the discharge pulse generator according to the invention is fitted for use with an electric discharge machine, a laser oscillator, a particle accelerator, etc.

What is claimed is:

1. A discharge pulse generator for supplying power between a pair of electrodes, comprising:
    at least one distribution constant line of a predetermined length being connected at one termination to the electrodes;
    charging means being connected to said distribution constant line for charging capacitance of said distribution constant line;
    rectification means being connected to an opposite termination of said distribution constant line in a direction in which no current flows relative to voltage of said charging means; and
    a resistor being connected in series to said rectification means and having a resistance value equal to characteristic impedance of said distribution constant line.

2. The discharge pulse generator as claimed in claim 1 wherein said charging means is implemented as a series body of a DC power supply, a resistor, and switching means and control means for turning on/off the switching means is provided.

3. The discharge pulse generator as claimed in claim 1 wherein said charging means is made up of a series body of DC power supply, a resistor, and a diode connected in a charging direction and switching means connected in parallel between the resistor and the DC power supply of the series body and control means for turning on/off the switching means is provided.

4. The discharge pulse generator as claimed in claim 1 wherein at least one of said distribution constant lines is a repetition circuit of discrete capacitors and inductors forming characteristic impedance equal to the characteristic impedance of said distribution constant line.

5. The discharge pulse generator as claimed in claim 1 wherein at least one of said distribution constant lines is implemented as a parallel body of a capacitor being connected in parallel to said rectification means and said resistor and an inductor and a resistor being connected in series to the capacitor and characteristic impedance based on the capacitor and the inductor and a resistance value of the resistor of the parallel body are equal to the characteristic impedance of said distribution constant line.

6. The discharge pulse generator as claimed in claim 1 wherein a current adjusting resistor is connected in series to the termination of said distribution constant line to which the electrode is connected.

7. The discharge pulse generator as claimed in claim 1 wherein the predetermined length of said distribution constant line is set so that propagation time of said distribution constant line becomes a half of any desired discharge current pulse width generated between the poles.

8. The discharge pulse generator for supplying power between a pair of electrodes, comprising:
- at least one distribution constant line of a predetermined length being connected at one termination to the electrode;
- charging means being connected to said distribution constant line for charging capacitance of said distribution constant line;
- rectification means being connected to an opposite termination of said distribution constant line in a direction in which no current flows relative to voltage of said charging means;
- a resistor being connected in series to said rectification means and having a resistance value equal to characteristic impedance of said distribution constant line; and
- a constant voltage source being connected in series to said rectification means.

9. The discharge pulse generator as claimed in claim 8 wherein said charging means is implemented as a series body of a DC power supply, a resistor, and switching means is provided.

10. The discharge pulse generator as claimed in claim 8 wherein said charging means is made up of series body of a DC power supply, a resistor, and a diode connected in a charging direction and switching means connected in parallel between the resistor and the DC power supply of the series body and control means for turning on/off the switching means is provided.

11. The discharge pulse generator as claimed in claim 8 wherein at least one of said distribution constant lines is a repetition circuit of discrete capacitors and inductors forming characteristic impedance equal to the characteristic impedance of said distribution constant line.

12. The discharge pulse generator as claimed in claim 8 wherein at least one of said distribution constant lines is implemented as a parallel body of a capacitor being connected in parallel to said rectification means and said resistor and an inductor and a resistor being connected in series to the capacitor and characteristic impedance based on the capacitor and the inductor and resistance value of the resistor of the parallel body are equal to the characteristic impedance of said distribution constant line.

13. The discharge pulse generator as claimed in claim 8 wherein a current adjusting resistor is connected in series to the termination of said distribution constant line to which the electrode is connected.

14. The discharge pulse generator as claimed in claim 8 wherein the predetermined length of said distribution constant line is set so that propagation time of said distribution constant line becomes a half of any desired discharge current pulse width generated between the poles.

15. A discharge pulse generator for supplying power between a pair of electrodes, comprising:
- at least one distribution constant line of a predetermined length being connected at one termination to the electrode;
- charging means being connected to said distribution constant line for charging capacitance of said distribution constant line;
- rectification means being connected to an opposite termination of said distribution constant line in a direction in which no current flows relative to voltage of said charging means;
- a resistor being connected in series to said rectification means and having a resistance value equal to characteristic impedance of said distribution constant line;
- voltage detection means for detecting voltage of said resistor;
- voltage polarity determination means for determining polarity of the voltage of said resistor detected by said voltage detection means; and
- charging stop means for stopping charging of said charging means if said voltage polarity determination means determines that the polarity of the voltage is opposite to polarity just before discharge.

16. The discharge pulse generator as claimed in claim 15 wherein at least one of said distribution constant lines is a repetition circuit of discrete capacitors and inductors forming characteristic impedance equal to the characteristic impedance of said distribution constant line.

17. The discharge pulse generator as claimed in claim 15 wherein at least one of said distribution constant lines is implemented as a parallel body of a capacitor being connected in parallel to said rectification means and said resistor and an inductor and a resistor being connected in series to the capacitor and characteristic impedance based on the capacitor and the inductor and a resistance value of the resistor of the parallel body are equal to the characteristic impedance of said distribution constant line.

18. The discharge pulse generator as claimed in claim 15 wherein a current adjusting resistor is connected in series to the termination of said distribution constant line to which the electrode is connected.

19. The discharge pulse generator as claimed in claim 15 wherein the predetermined length of said distribution constant line is set so that propagation time of said distribution constant line becomes a half of any desired discharge current pulse width generated between the poles.

20. A discharge pulse generator, for use with a wire electric discharge machine for supplying discharge energy between poles of a wire electrode and a workpiece, relatively moving the wire electrode and the workpiece by positioning means, and working on the workpiece, for generating the discharge energy, said discharge pulse generator comprising:
- a first distribution constant line and a second distribution constant line being connected at one terminations in parallel;
- an upper feeding part connecting an opposite termination of said first distribution constant line for supplying power to the wire electrode;
- a lower feeding part connecting an opposite termination of said second distribution constant line for supplying power to the wire electrode;
- charging means being connected to said first distribution constant line and said second distribution constant line for charging capacitances of said first distribution constant line and said second distribution constant line;
- rectification means being connected to the one terminations of said distribution constant lines in a direction in which no current flows relative to voltage of said charging means; and
- a resistor being connected in series to said rectification means and having a resistance value equal to characteristic impedance of said distribution constant line.

* * * * *